(12) United States Patent
Nations

(10) Patent No.: US 12,320,874 B2
(45) Date of Patent: Jun. 3, 2025

(54) LASER-BASED SUB-DOPPLER CIRCULAR DICHROISM SPECTROSCOPY IN FRC DEVICE

(71) Applicant: TAE TECHNOLOGIES, INC., Foothill Ranch, CA (US)

(72) Inventor: Marcel Nations, Mission Viejo, CA (US)

(73) Assignee: TAE TECHNOLOGIES, INC., Foothill Ranch (CA)

( * ) Notice: Subject to any disclaimer, the term of this patent is extended or adjusted under 35 U.S.C. 154(b) by 179 days.

(21) Appl. No.: 18/208,652

(22) Filed: Jun. 12, 2023

(65) Prior Publication Data

US 2023/0384402 A1    Nov. 30, 2023

Related U.S. Application Data

(63) Continuation of application No. PCT/US2021/063339, filed on Dec. 14, 2021.

(60) Provisional application No. 63/125,009, filed on Dec. 14, 2020.

(51) Int. Cl.
| | |
|---|---|
| *G01R 33/26* | (2006.01) |
| *G01J 3/447* | (2006.01) |
| *G21B 1/05* | (2006.01) |
| *G21B 1/23* | (2006.01) |

(52) U.S. Cl.
CPC .............. *G01R 33/26* (2013.01); *G01J 3/447* (2013.01); *G21B 1/052* (2013.01); *G21B 1/23* (2013.01)

(58) Field of Classification Search
CPC ......... G01R 33/26; G01J 3/447; G21B 1/052; G21B 1/23
See application file for complete search history.

(56) References Cited

U.S. PATENT DOCUMENTS

| | | |
|---|---|---|
| 2009/0073442 A1 | 3/2009 | Smith |
| 2012/0113423 A1 | 5/2012 | Groswasser |
| 2016/0097722 A1* | 4/2016 | Hur .......................... G01N 21/65 356/301 |
| 2019/0019584 A1* | 1/2019 | Cho ........................ G21B 1/23 |
| 2020/0027704 A1 | 1/2020 | Gupta et al. |

FOREIGN PATENT DOCUMENTS

WO    WO    3/2022
PCT/US2021/063339

OTHER PUBLICATIONS

Binderbauer, M. W., et al., "Recent breakthroughs on C-2U: Norman's legacy", 2016, AIP Conference Proceedings 1721, pp. 030003-1-030003-11.
Gota, H., et al., "Achievement of Field-Reversed Configuration Plasma Sustainment via 10 MW Neutral-Beam Injection on the C-2U Device", Nuclear Fusion, 2017, vol. 57, 99. 1-8.
Green, J.A., et al., "A quantum mechanical approach to establishing the magnetic field orientation from a maser Zeeman profile", MNRAS 440, 2014, pp. 2988-2996.

(Continued)

*Primary Examiner* — Gregory H Curran
(74) *Attorney, Agent, or Firm* — ONE LLP

(57) ABSTRACT

Systems, devices and methods that facilitate non-intrusive measurement and validation of field-reversal of a core plasma by combining DFSS and blended Zeeman concepts (i.e., sub-Doppler circular dichroism spectroscopy).

19 Claims, 8 Drawing Sheets

(56) References Cited

OTHER PUBLICATIONS

Jagadeeshwari, M., et al., "Internal magnetic field measurement in tokamak plasmas using a Zeeman polarimeter", Pramana, 2000, vol. 55, Nos. 5 & 6, pp. 751-756.
Javaux, C., et al., "Modulation-free pump-probe spectroscopy of strontium atoms", The European Physical Journal D, 2010, vol. 57, pp. 151-154.
Kochukhov, O., "Spectro-Polarimetry of Magnetic Hot Stars", Solar Polarization 4, 2006, vol. 358, pp. 345-354.
Martin, E. H., et al., "Applications of Doppler-free saturation spectroscopy for edge physics studies (invited)", Rev. Sci. Instrum., 2016, vol. 87, No. 11, pp. 11E042-1-11E042-6.
Stenflo, J. O., "Polarized Radiation Diagnostics of Solar Magnetic Fields", Chapter 1 of Astrophysical Spectropolarimetry, Proceedings of the XII Canary Islands Winter School of Astrophysics, Puerto de la Cruz, Tenerife, Spain, Nov. 13-24, 2000, pp. 55-100.
Tuszewski, M., "Field Reversed Configurations", Nuclear Fusion, 1988, vol. 28, No. 11, pp. 2033-2092.
Zafar, A., et al., "High Resolution Magnetic Field Measurements in Hydrogen and Helium Plasmas using Active Laser Spectroscopy", Rev. Sci. Instrum., 2018, vol. 89, No. 10, p. 1-4.
Zafar, A., et al., "Doppler-free, Stark Broadened Profiles at Low Plasma Densities in Helium", JQSRT, 2019, vol. 230, pp. 48-55.

\* cited by examiner

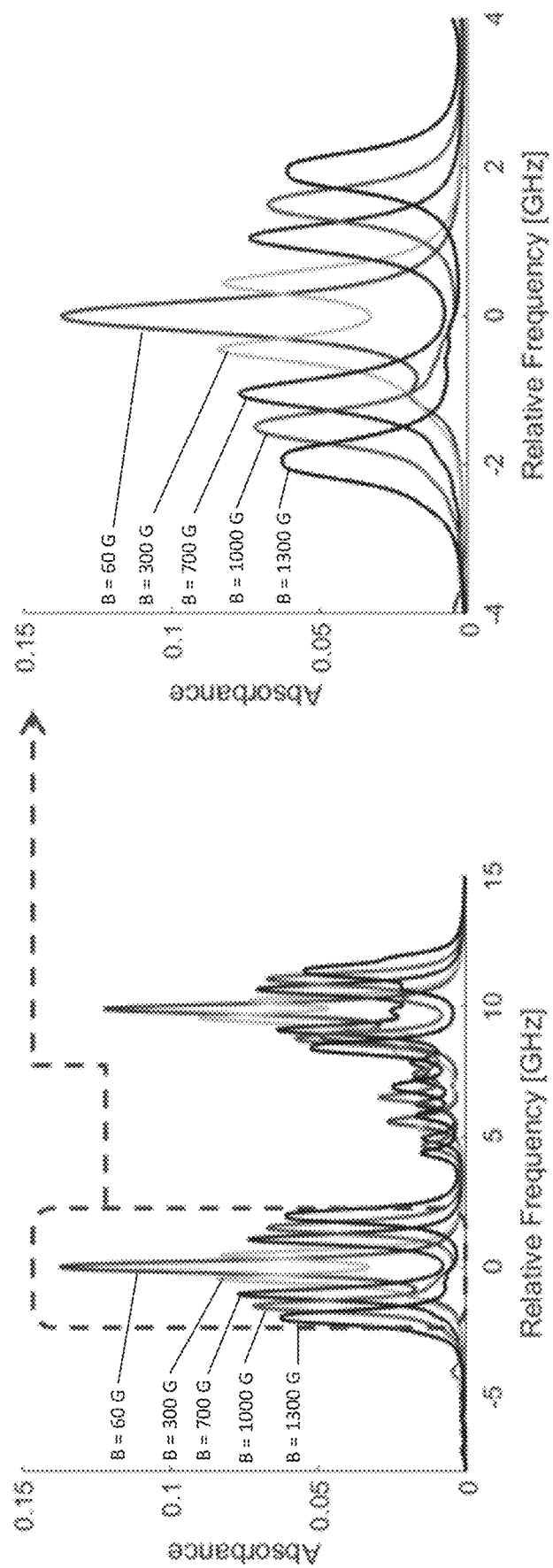

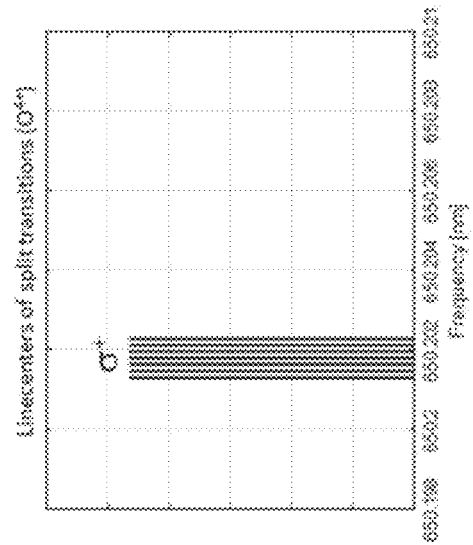
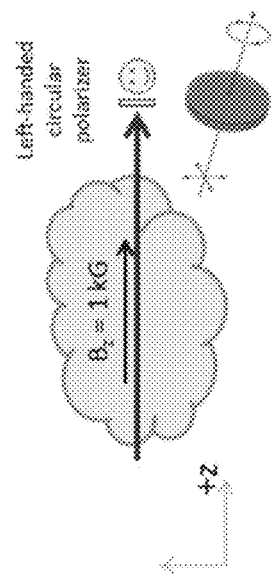
FIGURE 4A
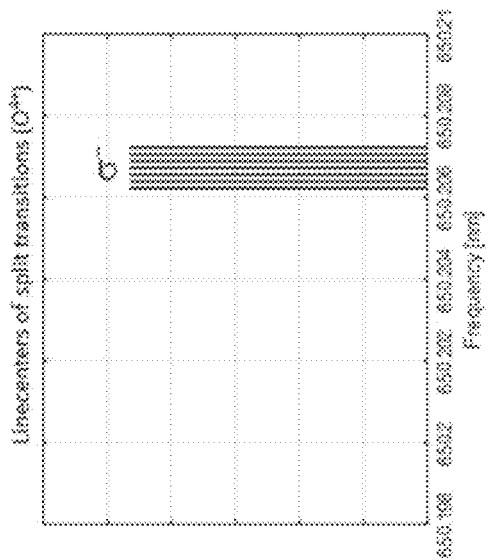
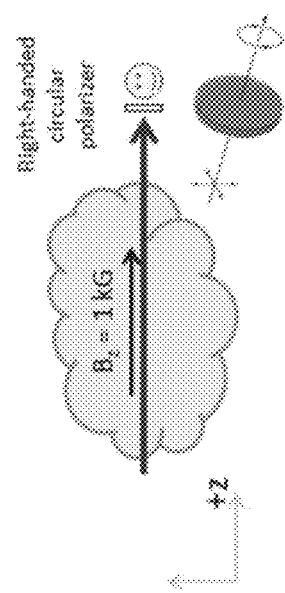
FIGURE 4B

LASER-BASED SUB-DOPPLER CIRCULAR DICHROISM SPECTROSCOPY IN FRC DEVICE

CROSS-REFERENCE TO RELATED APPLICATIONS

The subject application is a continuation of International Patent Application No. PCT/US2021/063339, filed Dec. 14, 2021, which claims priority to U.S. Provisional Patent Application No. 63/125,009, filed Dec. 14, 2020, both of which are incorporated by reference herein in their entireties for all purposes.

FIELD

The embodiments described herein relate generally to circular dichroism spectroscopy and, more particularly, to systems, devices and methods for laser-based sub-doppler circular dichroism spectroscopy that facilitates non-intrusive measurement and validation of field direction and reversal in a field reversed configuration magnetic field plasma confinement device.

BACKGROUND

The Field Reversed Configuration (FRC) belongs to the class of magnetic plasma confinement topologies known as compact toroids (CT). It exhibits predominantly poloidal magnetic fields and possesses zero or small self-generated toroidal fields (see M. Tuszewski et al., Nucl. Fusion 28, 2033 (1988)). The attractions of such a configuration are its simple geometry for ease of construction and maintenance, a natural unrestricted divertor for facilitating energy extraction and ash removal, and very high $\beta$ ($\beta$ is the ratio of the average plasma pressure to the average magnetic field pressure inside the FRC), i.e., high power density. The high $\beta$ nature is advantageous for economic operation and for the use of advanced, aneutronic fuels such as D-He3 and p-B11.

Example FRC devices are known to operate with a FRC topology driven by high energy neutral beam injection. (see Javaux, et al., The Europ. Phys. Journal D 57, pp. 151-154 (2010); Green, et al., MNRAS 440, pp. 2988-2996 (2014)). FRCs are unique in the sense that the axial magnetic field (Bz) inside the plasma separatrix reverses in direction with respect to the applied external field. This particular field configuration dictates specific plasma behavior (e.g., fast-ion orbits, current drive) and information of its spatial and temporal evolution is of fundamental importance for adequately understanding the underlying physics of the FRC devices. The use of insertable probes to map magnetic field profiles in the confinement vessel of the FRC device is prohibited by the harsh, high temperature environment in the plasma core. Not only can probes act as a source of impurity contaminant, the probes can also physically disrupt the plasma. As a result, non-perturbative spectroscopic techniques can offer substantial advantage as a magnetic field sensor over physical probes.

In most fusion devices, spectral lines are Doppler dominated due to the thermal motion of atoms at elevated plasma temperatures, smearing fine structure splitting due to magnetic fields (Zeeman effect). Doppler-free saturation spectroscopy (DFSS) is a well-studied robust technique which enables local measurements of the magnetic field magnitude by utilizing counter-propagating pump-probe beams and significantly reducing Doppler broadening. (see Binderbauer et al., AIP Conf. Proc. 1721, 030003 (2016); Gota et al., Nucl. Fusion 57, 116021 (2017); Zafar et al., Rev. Sci. Instrum. 89, 10D126 (2018))

The narrow linewidth (<1 MHz) of diode lasers enable a reduction in instrument broadening by orders of magnitude compared to optical emission spectroscopy (OES) measurements. As a result, the fine structure of lines can be resolved by rapidly tuning (>1 kHz) a diode laser in frequency-space across atomic transitions and the magnetic field magnitude can be readily inferred from the distance between split peaks.

DFSS using linearly polarized pump and probe beams have been proposed as a method to measure the magnetic field in an FRC. As depicted in FIG. 1, the polarized pump and probe beams 12 and 14 are pitched in opposite directions perpendicular to the longitudinal axis of a confinement vessel 10 with an FRC plasma 30 positioned within the confinement vessel 30. The polarized pump and probe beams 12 and 14 are aligned at a small angle of a few degrees for a local measurement at the crossing point within the FRC plasma. This method exploits the "transverse Zeeman effect" and is particularly useful in FRCs due to its ability to resolve the fine structure of lines at relatively low fields (<1 kG) in the plasma core. Simulation results showing Doppler broadened ad DFSS spectra of H-alpha are depicted in FIGS. 2A and 2B, while simulation results showing DF SS spectra of H-alpha showing the symmetric splitting of the fine structure in the presence of magnetic fields of varying strengths are depicted in FIGS. 3A and 3B.

A major drawback of this technique is that it is limited to determining the magnetic field strength but not direction. This has to do with the fact that the measured fine structure splitting due to the presence of a magnetic field is symmetric about its original frequency. Note that one of the key desired features of a laser-based diagnostic targeting internal magnetic field structure of an FRC is its capability to measure the direction of the field and confirm the presence of field-reversed plasma.

In astrophysics, "blended Zeeman" (i.e., Zeeman polarimetry) is a technique often employed to measure the magnetic field structure of hot stars. (see Martin et al., Rev. Sci. Instrum. 87, 11E402 (2016); Zafar, et al., JQSRT 230, pp. 48-55 (2019)). Similarly to fusion machines, in hot stars spectral lines are typically smeared by Doppler broadening. As depicted in FIGS. 4A and 4B, this passive OES technique takes advantage of spectral asymmetries as seen through circular polarizers. When viewed from a direction parallel to the magnetic field vector, radiation is circularly polarized clockwise for $\Delta M=+1$ ($\sigma$+transitions) and counterclockwise for $\alpha M=-1$ ($\sigma$-transitions), where M is the magnetic quantum number of individual eigenstates. Intensity is zero for the $\Delta M=0$ line components ($\pi$ transitions). The measurement is based on the determination of the intensity difference between two (right and left) circularly polarized profiles of a spectral line. (see Kochukhov et al., *Solar Polarization* 4 358, p. 345. (2006)). Emitted light viewed through a left-handed circular polarizer should transmit only the $\sigma$+ transitions of the spectra. Similarly, emitted light viewed through a right-handed circular polarizer should transmit only the $\sigma$- transitions. The peaks of two Doppler broadened lineshapes, each seen through circular polarizers of opposite orientation, will be slightly shifted. As depicted in FIG. 5A, the stronger the field, the larger the shift. As depicted in FIG. 5B, the difference between the intensities of the circularly polarized profiles is directly proportional to the component of the magnetic field along the line-of-sight. One of the key features of this technique comes from the asymmetric nature of the resulting differential signal. If the applied magnetic field flips direction, so will the direction that both σ+ and σ− components will shift in frequency-space. As depicted in FIGS. 6A and 6B, the slope of the asymmetric profile obtained from the difference between the intensities of the circularly polarized profiles flips direction Measured "blended Zeeman" spectra is Doppler broadened which means it can only resolve magnetic fields of sufficient strength ($Bz>1$ T) for a useful dispersion-shaped differential signal; the field inside the FRC is fairly low (e.g., $Bz<0.06$ T for Norman) and not resolvable. Moreover, since it is a passive emission technique, instrument broadening imposes further limits in achievable magnetic field resolution. Lastly, it is a line-integrated measurement and requires complex inversion methods to extract local values which can complicate and perhaps hinder interpretation of measured signals.

Improved systems, devices, and methods that facilitate non-intrusive measurement and validation of field direction and reversal in a field reversed configuration magnetic field plasma confinement device are desired.

SUMMARY

Example embodiments of systems, devices, and methods are provided herein for laser-based sub-doppler circular dichroism spectroscopy that facilitates non-intrusive measurement and validation of field direction and reversal in a field reversed configuration magnetic field plasma confinement device. The laser-based method for measuring the magnetic field direction in a field-reversed configuration (FRC) fusion device using circular dichroism is analogous to techniques used for laser frequency stabilization, however it has not been utilized in the context of measuring magnetic field direction in fusion devices. The method exploits the circular polarizations of the absorbed laser light which are shifted in frequency due to the longitudinal Zeeman effect (line-of-sight component parallel to the magnetic field). In example embodiments, the proposed method utilizes counter-propagating beams from a narrow linewidth (<10 MHz) tunable diode laser source to significantly reduce Doppler broadening and resolve the fine structure of target atomic lines. Linearly-polarized probe and pump beams cross at a particular location inside the fusion device for a local measurement. After leaving the vessel, the probe beam passes first through a quarter-wave plate which maps the two circular polarization components into two orthogonal linear polarization components. The beam then passes through a polarization beam splitter to be detected by a balanced detector. The resulting measured signal is the difference between the two Zeeman-split σ+ and σ− absorption curves (a dispersion-shaped differential signal). The direction of the field can be inferred directly from the sign of the signal slope at zero crossing. The distance between the positive and negative peaks of the measured differential signal corresponds to the total splitting between the center of the σ+ and σ− transitions and is proportional to the field strength.

In example embodiments, the method can be used to assess the presence of a reversed field inside the plasma in the context of a field-reversed configuration (FRC) device.

Other systems, devices, methods, features and advantages of the subject matter described herein will be or will become apparent to one with skill in the art upon examination of the following figures and detailed description. It is intended that all such additional systems, methods, features and advantages be included within this description, be within the scope of the subject matter described herein, and be protected by the accompanying claims. In no way should the features of the example embodiments be construed as limiting the appended claims, absent express recitation of those features in the claims.

BRIEF DESCRIPTION OF FIGURES

The details of the subject matter set forth herein, both as to its structure and operation, may be apparent by study of the accompanying figures, in which like reference numerals refer to like parts. The components in the figures are not necessarily to scale, emphasis instead being placed upon illustrating the principles of the subject matter. Moreover, all illustrations are intended to convey concepts, where relative sizes, shapes and other detailed attributes may be illustrated schematically rather than literally or precisely.

FIGS. 3A and 3B are graphs of simulation results showing DFSS spectra of H-alpha showing the symmetric splitting of the fine structure in the presence of magnetic fields of varying strengths.

FIGS. 4A and 4B are graphs of simulation results showing fine structure of $O^{4+}$ at 650 nm with an applied magnetic field parallel to the line-of-sight.

DETAILED DESCRIPTION

Before the present subject matter is described in detail, it is to be understood that this disclosure is not limited to the particular embodiments described, as such may, of course, vary. It is also to be understood that the terminology used herein is for the purpose of describing particular embodiments only, and is not intended to be limiting, since the scope of the present disclosure will be limited only by the appended claims.

The present disclosure is directed to systems, devices and methods that facilitate non-intrusive measurement and validation of field-reversal of a core plasma by combining DFSS and "blended Zeeman" concepts (i.e., sub-Doppler circular dichroism spectroscopy). A similar scheme with counter-propagating pump and probe beams would be employed to enable a local measurement of the Doppler-free spectra. However, instead of sampling the "transverse Zeeman effect" by pitching the beams perpendicular to longitudinal axis of the confinement vessel, the "longitudinal Zeeman effect" can be exploited by pitching both pump and probe beams along the longitudinal axis of the confinement vessel (or with a substantial vector component in the z-direction, parallel to the longitudinal axis of the confinement vessel). In this configuration, the absorption profiles of the two circularly polarized components that comprise the linearly polarized probe beam are shifted to higher and lower frequencies, respectively. The counter-propagating pump beam would enable a Doppler-free, local measurement with almost no instrument broadening (due to the narrow linewidth nature of diode lasers). This method is analogous to techniques used for laser frequency stabilization (locking). (see Stenflo, *Polarized radiation diagnostics of solar magnetic fields* (2002); Jagadeeshwari et al., Pramana 55, pp. 751-756 (2000)).

Figure 1:
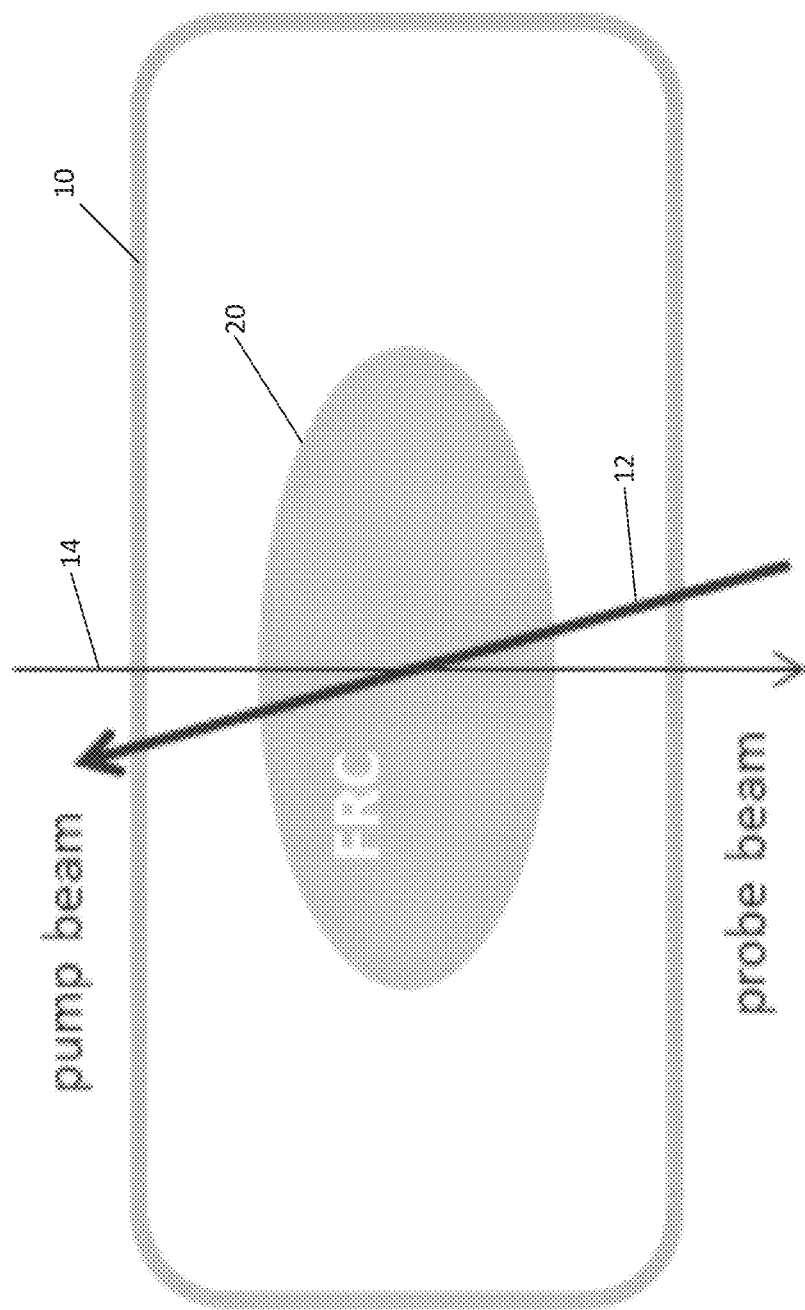
FIG. 1 is a schematic of the proposed Doppler-free saturation spectroscopy (DFSS) setup in an FRC device for probing the internal magnetic field from the transverse Zeeman effect (beam propagation perpendicular to the direction of the filed along the longitudinal axis of the confinement vessel).
Figure 2A:
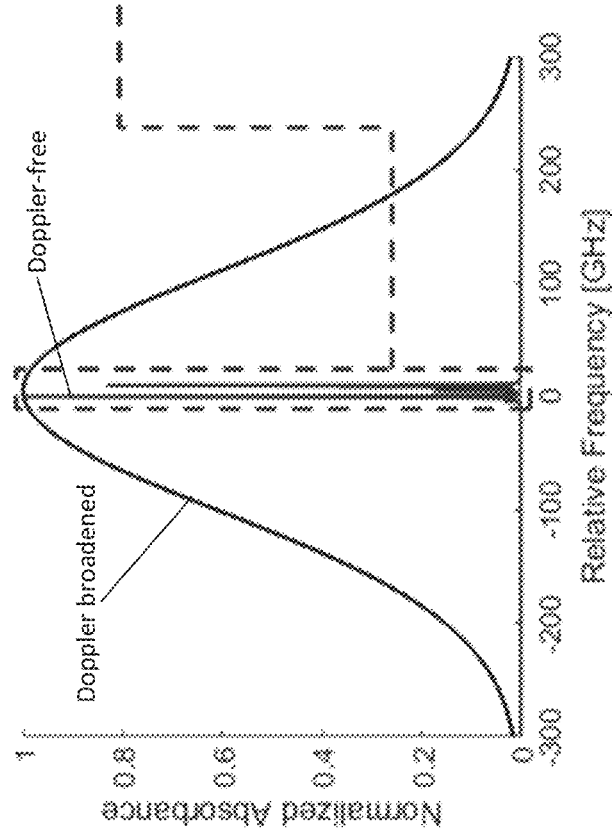
FIGS. 2A and 2B are graphs of simulation results showing Doppler broadened ad DFSS spectra of H-alpha.
Figure 2B:
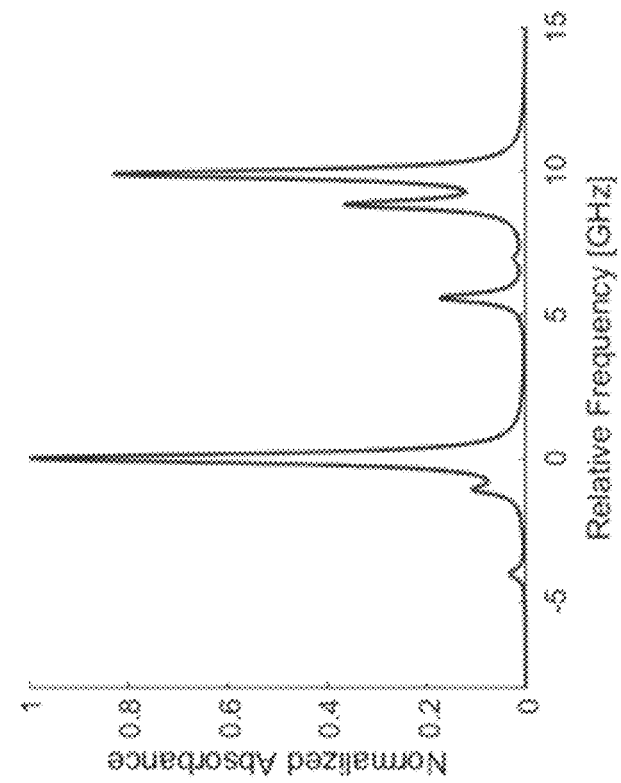
Figure 5A:
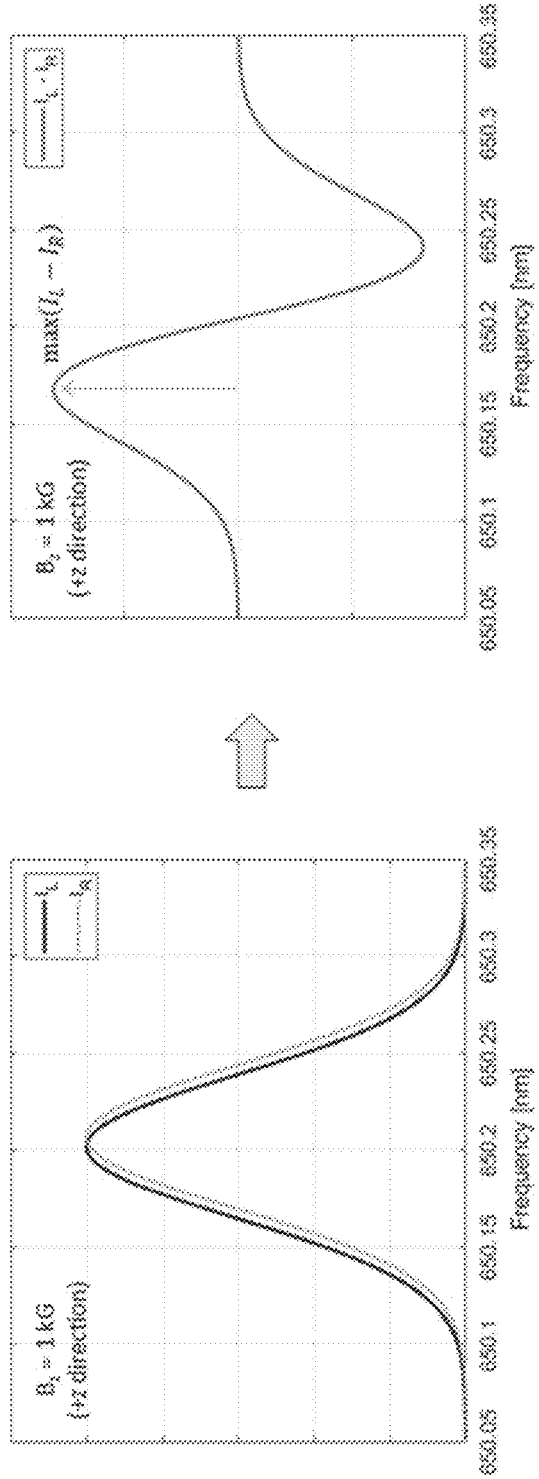
FIGS. 5A and 5B are graphs showing Doppler broadened and differential spectra of $O^{4+}$ for a magnetic field vector pointing toward (FIG. 5A) and away (FIG. 5B) from the observer as seen through left-handed and right-handed circular polarizers. Magnetic field direction and strength can be extracted from the direction of asymmetry and amplitude of the signal, respectively.
Figure 5B:
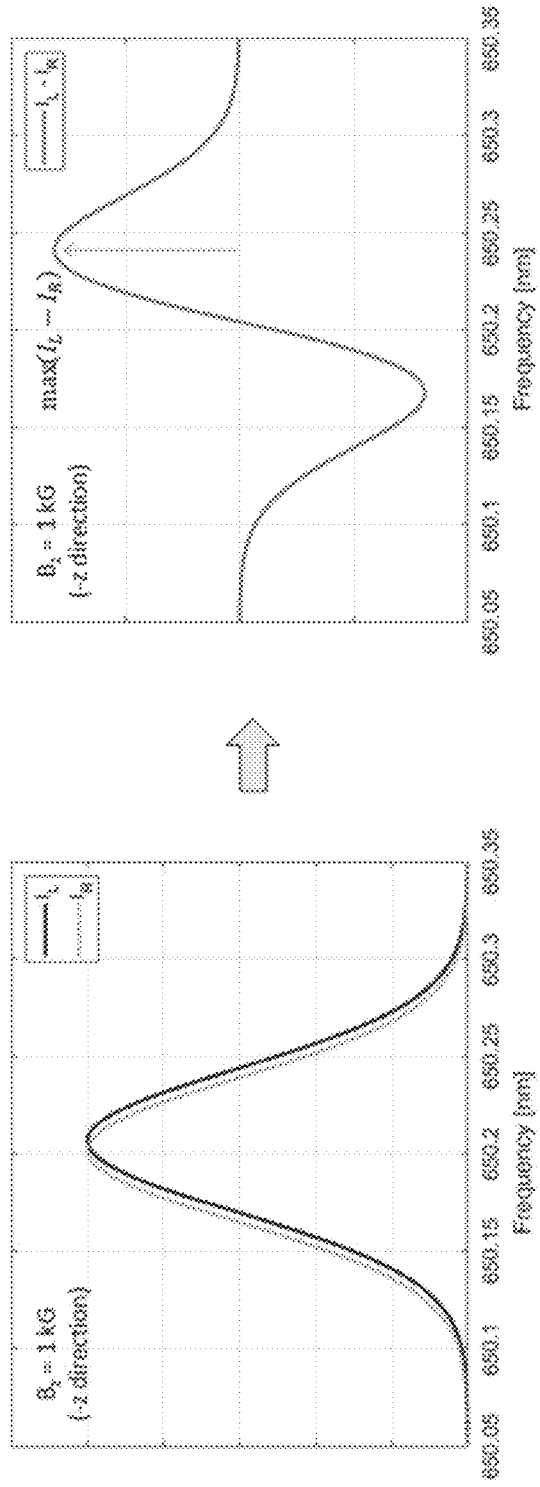
Figure 6B:
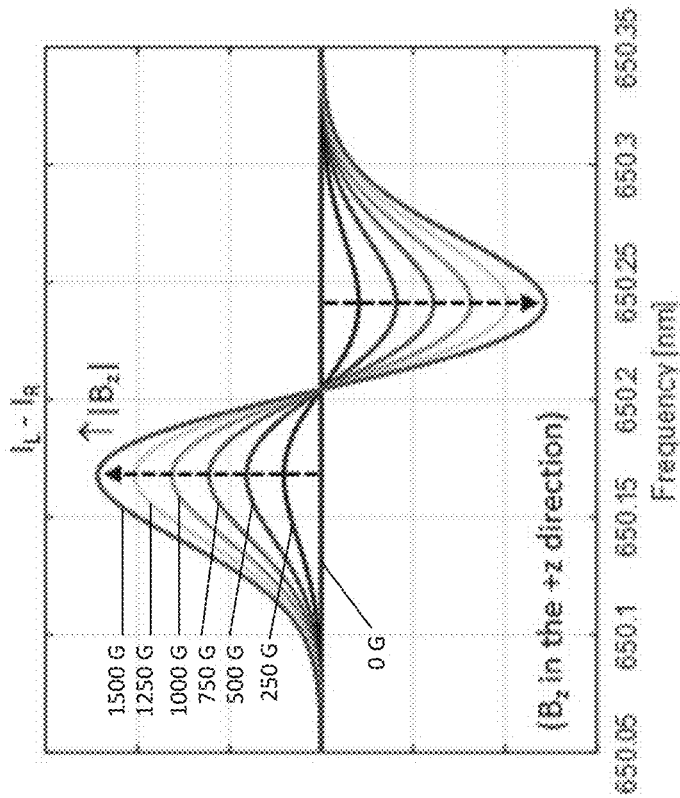
FIGS. 6A and 6B are graphs showing differential signal of $O^{4+}$ from blended Zeeman as a function of field strength for a fixed Doppler width.
Figure 6A:
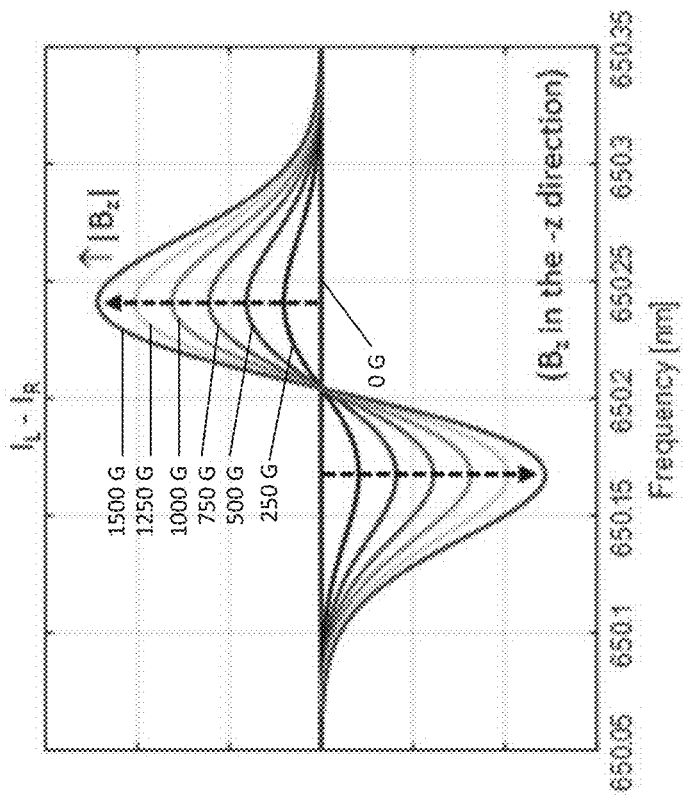
Figure 7:
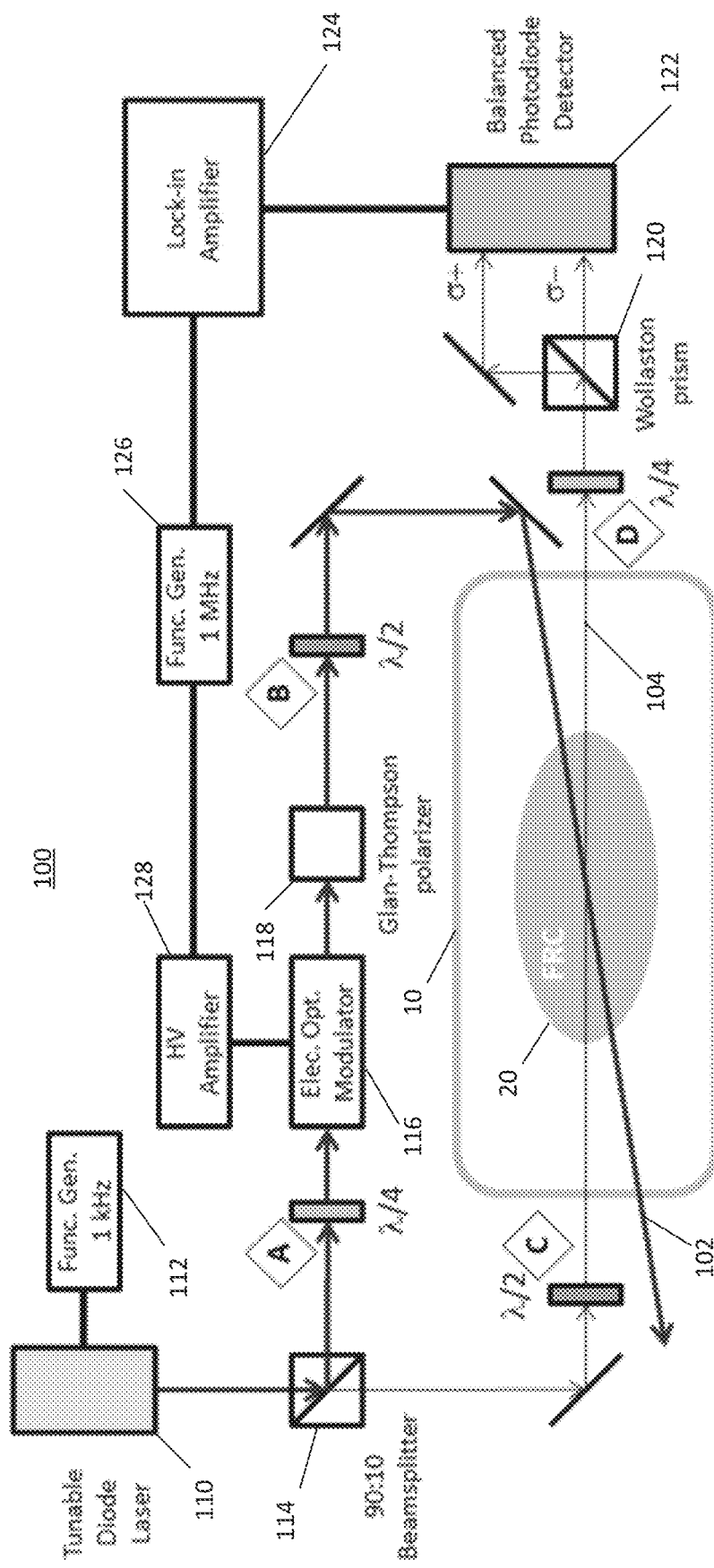
FIG. 7 is a schematic of an experimental setup of an example embodiment of a system for measuring field-reversal an FRC device using sub-Doppler circular dichroism spectroscopy.
Figure 8A:
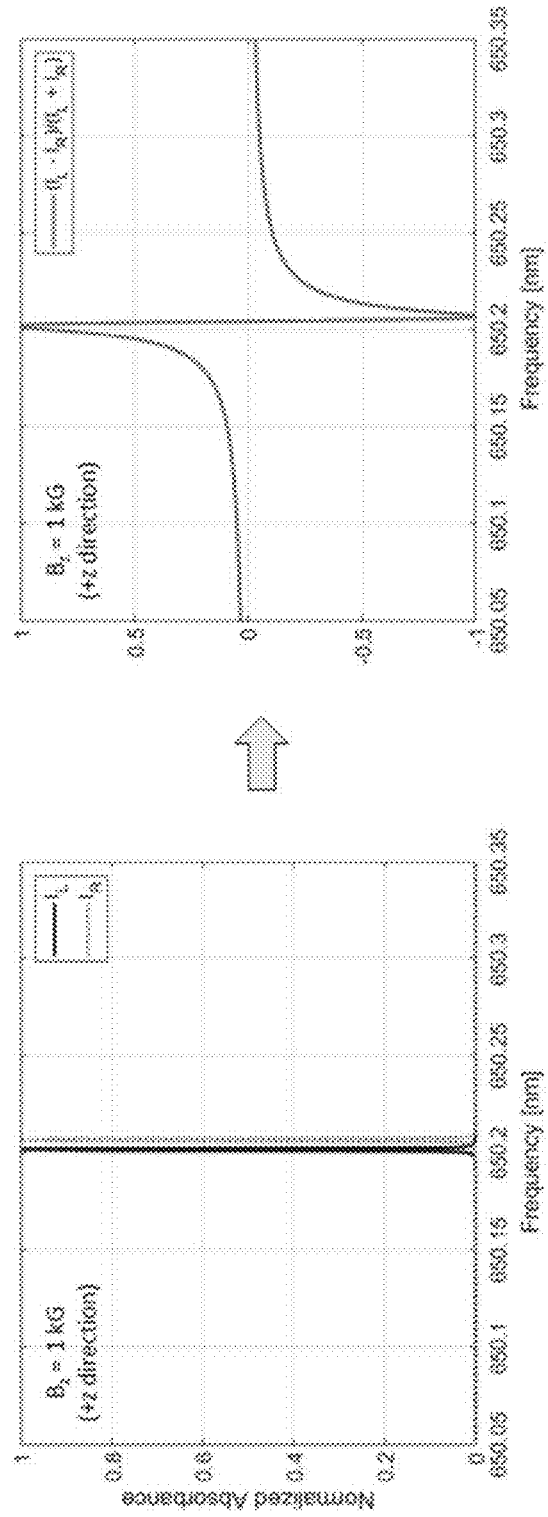
FIGS. 8A and 8B are graphs of simulation results showing sub-Doppler circular dichroism spectra and resulting differential signal for an $O^{4+}$ transition near 650 nm. The frequency shift of σ+ and σ− lines changes direction when the magnetic field direction flips by 180°. The asymmetry in the dispersion-shaped differential signal also changes, a powerful method to assess the field direction (sign of slope between positive and negative peaks) and magnitude (distance between positive and negative peaks).
Figure 8B:
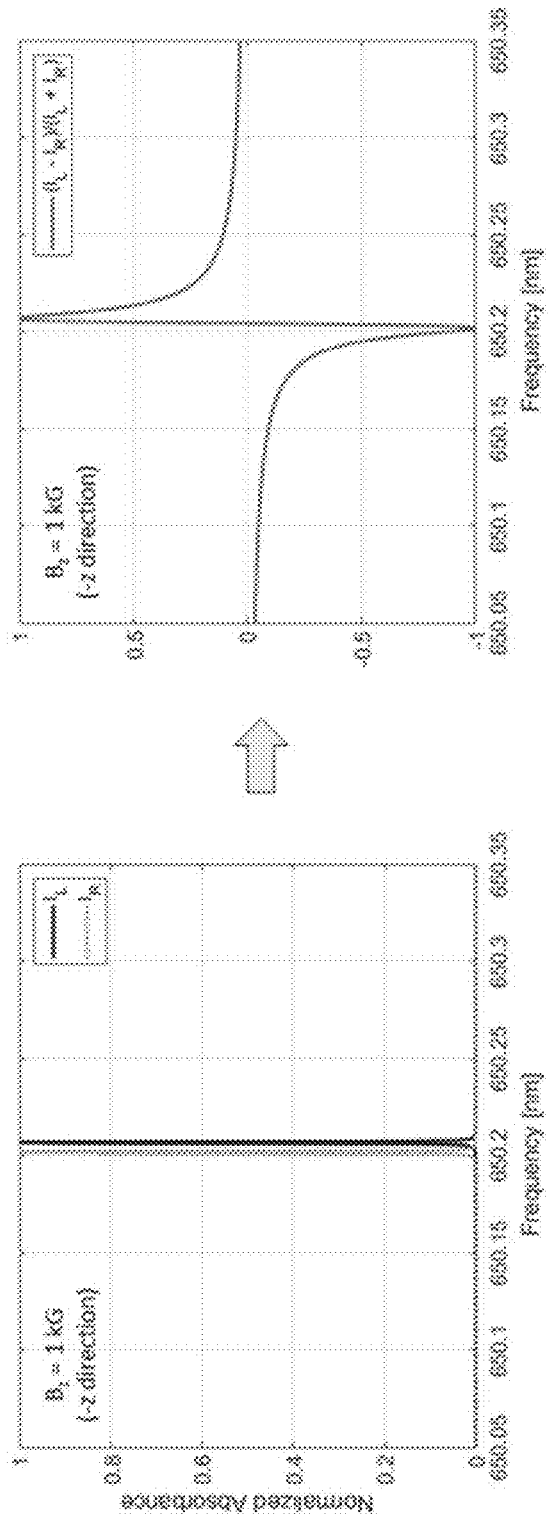

Turning to FIG. 7, a sub-Doppler circular dichroism spectroscopy (SDCDS) system 100 for measuring field-reversal in an FRC device 10 is shown in FIG. 7. As depicted, an example embodiment of the SDCDS system 100 includes a tunable diode laser source 110 with a 1 kHz function generator 112, a 90:10 beamsplitter 114, a first and second half-wave plates B and C, first and second quarter-wave plates A and D, an electro optical modulator 116, a polarizing prism 118 (e.g., a Glan-Thompson polarizer), a polarization beamsplitter 120 (e.g., Wollaston prism), a balanced detector 122 (e.g., a balance photodiode detector), a lock in amplifier 124, a 1 MHz function generator 126, and a HV amplifier 128. A beam 101 exiting the laser source 110 passes through the 90:10 beamsplitter 114 and is split into pump and probe beams 102 and 104. The pump beam 102 passes through the first quarter-wave plate A, the electro optical modulator 116 and the polarizing prism 128. The pump and probe beams 102 and 104 then pass through the first and second half-wave plates B and C to ensure the beams are linearly polarized in the same direction prior to entering the confinement vessel 10 of the FRC device along the longitudinal axis of the confinement vessel 10 (or with a substantial vector component in the z-direction, parallel to the longitudinal axis of the confinement vessel 10). Note that linearly polarized light is comprised of a superposition of both clockwise and counter-clockwise circular polarizations. After propagating through the confinement vessel 10, and an FRC plasma 20 contained within the confinement vessel 10, the probe beam 104 passes first through the second quarter-wave plate D which maps the two circular polarization components into two orthogonal linear polarization components. The probe beam 104 then passes through the polarization beamsplitter 120 to be detected by the balanced detector 122. The resulting measured signal is the difference between the Zeeman-split σ+ and the Zeeman-split σ− absorption curves, also a dispersion-shaped differential signal (also referred to as error signal). The direction of the field can be inferred directly from the sign of the signal slope at zero crossing. If the quarter-wave plate's axis is oriented 45° from the axis of the input linear polarizer, then the two absorption components will be equal in intensity after being split by the polarizing beamsplitter 120. The distance between the positive and negative peaks of the measured differential signal corresponds to the total splitting between the center of the σ+ and σ− transitions and is proportional to the field strength as shown in FIGS. 8A and 8B. Thus, such approach would provide spatially and temporally resolved measurements of the magnetic field magnitude and direction in the core of the FRC.

As noted above with regard to DFSS with linearly polarized light (transverse Zeeman effect), the major drawback of this technique is that it is limited to determining the magnetic field strength but not direction. The example embodiments discussed herein overcome this shortcoming by allowing one to determine the direction of the field. In the context of an FRC device, this is important in lieu of determining whether a reversed field topology has indeed been achieved.

The example embodiments discussed herein overcome the shortcomings of blended Zeeman approach by providing (i) a Doppler-free spectra with resolvable fine structure; magnetic field resolution of a few Gauss, (ii) a local measurement instead of line-integrated (significantly better spatial resolution), (iii) rapid laser modulation that allows for very high time-resolution measurements, and (iii) negligible instrument broadening.

Without significantly altering the aforementioned configuration for sub-Doppler circular dichroism spectroscopy, polarization spectroscopy (see Javaux et al., The Europ. Phys. Journal D 57, pp. 151-154 (2010); Green et al., MNRAS 440, pp. 2988-2996 (2014)) can also be explored in the context of longitudinal Zeeman splitting to extract information about the local magnetic field inside the FRC plasma. This can be achieved by swapping wave plates B and D, and setting the optical axis of the half-wave plate B at 90 degrees with respect to the polarization axis of half-wave plate C. As a result, the weaker probe beam sees the plasma placed between crossed polarizing filters, such that initially little light reaches the detector. The pump beam now passes through quarter-wave plate D, giving light a circular polarization. The circularly polarized pump beam induces a birefringence in the plasma, which is interrogated by the counter-propagating, linearly polarized probe beam. The preferential absorption of atoms with one particular circular polarization leads to an elliptically polarized probe beam with the axis of the ellipse rotated from its original linear polarization plane. The probe beam is initially linearly polarized at $\phi=\pi/4$ to the axes of the Wollaston prim such that the difference signal output from the balanced detector is essentially zero in the absence of the pump beam. In the presence of the pump beam, a component of the beam can pass through the cross polarizing filter and a non-zero signal will register at the detector. The measured polarization signal will have an asymmetric, dispersion-shaped profile which can also be analyzed for accessing the direction and magnitude of the magnetic field and, consequently, validate the presence of a reversed field in the C-2W device.

Although the present disclosure focuses on measurements of the local magnetic field direction inside of the FRC, the combined use of both linear and circular polarizations can provide a direct measurement of the magnetic field vector anywhere in the device. The measurement technique can be used in any other fusion device where non-intrusive, local measurements of the magnetic field vector are needed (e.g., Tokamaks, stellerators, etc.). Note that although the technique has been demonstrated here on an impurity ion, it would also work on main species as well (neutral hydrogen and deuterium).

According to an embodiment of the present disclosure, a method for measuring the magnetic field direction in a field-reversed configuration (FRC) plasma comprising generating linearly polarized probe and pump beams, and counter-propagating the pump and probe beams along a longitudinal axis of a confinement vessel containing an FRC plasma.

According to a further embodiment of the present disclosure, generating linearly polarized probe and pump beams includes generating the pump and probe beams from a laser source.

According to a further embodiment of the present disclosure, the laser source is a tunable diode laser source.

According to a further embodiment of the present disclosure, the method further comprising splitting a beam from the laser source with a beamsplitter into the pump and probe beams.

According to a further embodiment of the present disclosure, the beamsplitter is a 90-to-10 beamsplitter.

According to a further embodiment of the present disclosure, counter-propagating the pump and probe beams includes crossing the pump and probe beams at a predetermined location with the confinement vessel.

According to a further embodiment of the present disclosure, the method further comprising passing the probe beam through a first quarter-wave plate two circular polarization components of the probe beam into two orthogonal linear polarization components.

According to a further embodiment of the present disclosure, the method further comprising passing the probe beam through a polarization beam splitter and detecting the probe beam with a balanced detector to measure the difference between Zeeman split absorption curves.

According to a further embodiment of the present disclosure, the method further comprising passing the pump beam through a second quarter-wave plate.

According to a further embodiment of the present disclosure, the method further comprising passing the pump and probe beams, respectively, through first and second half-wave plates before propagating through the confinement vessel.

According to an embodiment of the present disclosure, a sub-Doppler circular dichroism spectroscopy system for measuring field-reversal in an FRC plasma comprising a laser source for generating a laser beam, and a plurality of optical components optically coupled and configured to generate linearly polarized probe and pump beams, and counter-propagate the pump and probe beams along a longitudinal axis of a confinement vessel containing an FRC plasma.

According to a further embodiment of the present disclosure, the plurality of optical components include a beamsplitter optically coupled to the laser source, first and second quarter wave plates and first and second half wave plates optically coupled to the beamsplitter, a polarizer beamsplitter optically coupled to one of the first and second quarter wave plates, and a balanced detector coupled to the polarizer beamsplitter.

Various aspects of the present subject matter are set forth below, in review of, and/or in supplementation to, the embodiments described thus far, with the emphasis here being on the interrelation and interchangeability of the following embodiments. In other words, an emphasis is on the fact that each feature of the embodiments can be combined with each and every other feature unless explicitly stated otherwise or logically implausible.

Processing circuitry can include one or more processors, microprocessors, controllers, and/or microcontrollers, each of which can be a discrete or stand-alone chip or distributed amongst (and a portion of) a number of different chips. Any type of processing circuitry can be implemented, such as, but not limited to, personal computing architectures (e.g., such as used in desktop PC's, laptops, tablets, etc.), programmable gate array architectures, proprietary architectures, custom architectures, and others. Processing circuitry can include a digital signal processor, which can be implemented in hardware and/or software. Processing circuitry can execute software instructions stored on memory that cause processing circuitry to take a host of different actions and control other components.

Processing circuitry can also perform other software and/or hardware routines. For example, processing circuitry can interface with communication circuitry and perform analog-to-digital conversions, encoding and decoding, other digital signal processing, multimedia functions, conversion of data into a format (e.g., in-phase and quadrature) suitable for provision to communication circuitry, and/or can cause communication circuitry to transmit the data (wired or wirelessly).

Any and all signals described herein can be communicated wirelessly except where noted or logically implausible. Communication circuitry can be included for wireless communication. The communication circuitry can be implemented as one or more chips and/or components (e.g., transmitter, receiver, transceiver, and/or other communication circuitry) that perform wireless communications over links under the appropriate protocol (e.g., Wi-Fi, Bluetooth, Bluetooth Low Energy, Near Field Communication (NFC), Radio Frequency Identification (RFID), proprietary protocols, and others). One or more other antennas can be included with communication circuitry as needed to operate with the various protocols and circuits. In some embodiments, communication circuitry can share antenna for transmission over links. Processing circuitry can also interface with communication circuitry to perform the reverse functions necessary to receive a wireless transmission and convert it into digital data, voice, and/or video. RF communication circuitry can include a transmitter and a receiver (e.g., integrated as a transceiver) and associated encoder logic.

Processing circuitry can also be adapted to execute the operating system and any software applications, and perform those other functions not related to the processing of communications transmitted and received.

Computer program instructions for carrying out operations in accordance with the described subject matter may be written in any combination of one or more programming languages, including an object oriented programming language such as Java, JavaScript, Smalltalk, C++, C#, Transact-SQL, XML, PHP or the like and conventional procedural programming languages, such as the "C" programming language or similar programming languages.

Memory, storage, and/or computer readable media can be shared by one or more of the various functional units present, or can be distributed amongst two or more of them (e.g., as separate memories present within different chips). Memory can also be a separate chip of its own.

To the extent the embodiments disclosed herein include or operate in association with memory, storage, and/or computer readable media, then that memory, storage, and/or computer readable media are non-transitory. Accordingly, to the extent that memory, storage, and/or computer readable media are covered by one or more claims, then that memory, storage, and/or computer readable media is only non-transitory. The terms "non-transitory" and "tangible" as used herein, are intended to describe memory, storage, and/or computer readable media excluding propagating electromagnetic signals, but are not intended to limit the type of memory, storage, and/or computer readable media in terms of the persistency of storage or otherwise. For example, "non-transitory" and/or "tangible" memory, storage, and/or computer readable media encompasses volatile and non-volatile media such as random access media (e.g., RAM, SRAM, DRAM, FRAM, etc.), read-only media (e.g., ROM, PROM, EPROM, EEPROM, flash, etc.) and combinations thereof (e.g., hybrid RAM and ROM, NVRAM, etc.) and variants thereof.

It should be noted that all features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. It is explicitly acknowledged that express recitation of every possible combination and substitution is overly burdensome, especially given that the permissibility of each and every such combination and substitution will be readily recognized by those of ordinary skill in the art.

As used herein and in the appended claims, the singular forms "a," "an," and "the" include plural referents unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

What is claimed:

1. A method for measuring the magnetic field direction in a field-reversed configuration (FRC) plasma comprising,
   generating linearly polarized probe and pump beams, and
   counter-propagating the pump and probe beams along a longitudinal axis of a confinement vessel containing an FRC plasma.

2. The method of claim 1 wherein the step of generating linearly polarized probe and pump beams includes generating the pump and probe beams from a laser source.

3. The method of claim 2 wherein the laser source is a tunable diode laser source.

4. The method of claim 2 further comprising splitting a beam from the laser source with a beam splitter into the pump and probe beams.

5. The method of claim 4 wherein the beam splitter is a 90-to-10 beam splitter.

6. The method of claim 1 wherein the step of counter-propagating the pump and probe beams includes crossing the pump and probe beams at a predetermined location with the confinement vessel.

7. The method of claim 6 further comprising passing the probe beam through a first quarter-wave plate two circular polarization components of the probe beam into two orthogonal linear polarization components.

8. The method of claim 7 further comprising passing the probe beam through a polarization beam splitter and detecting the probe beam with a balanced detector to measure the difference between Zeeman split absorption curves.

9. The method of claim 7 further comprising passing the pump beam through a second quarter-wave plate.

10. The method of claim 1 further comprising passing the pump and probe beams, respectively, through first and second half-wave plates before propagating through the confinement vessel.

11. The method of claim 2 further comprising passing the pump and probe beams, respectively, through first and second half-wave plates before propagating through the confinement vessel.

12. The method of claim 8 further comprising passing the pump beam through a second quarter-wave plate.

13. A sub-Doppler circular dichroism spectroscopy system for measuring field-reversal in an FRC plasma comprising
   a beam source for generating a beam, and
   a plurality of optical components optically coupled and configured to generate linearly polarized probe and pump beams, and counter-propagate the pump and probe beams along a longitudinal axis of a confinement vessel containing an FRC plasma.

14. The system of claim 13, wherein the plurality of optical components comprise
   a beam splitter optically coupled to the beam source,
   first and second quarter wave plates and first and second half wave plates optically coupled to the beam splitter,
   a polarizer beam splitter optically coupled to one of the first and second quarter wave plates, and
   a balanced detector coupled to the polarizer beam splitter.

15. The system of claim 13, wherein beam source is a laser source.

16. The system of claim 15, wherein laser source is a tunable diode laser source.

17. The system of claim 15, further comprising a beam splitter coupled to the laser source and configured to split a beam from the laser source into the pump and probe beams.

18. The system of claim 17, wherein the beam splitter is a 90-to-10 beam splitter.

19. The system of claim 15, wherein the plurality of optical components comprise
   a beam splitter optically coupled to the laser source,
   first and second quarter wave plates and first and second half wave plates optically coupled to the beam splitter,
   a polarizer beam splitter optically coupled to one of the first and second quarter wave plates, and
   a balanced detector coupled to the polarizer beam splitter.

* * * * *